US008038904B2

(12) United States Patent
Alekel

(10) Patent No.: US 8,038,904 B2
(45) Date of Patent: Oct. 18, 2011

(54) METHOD AND STRUCTURE FOR NON-LINEAR OPTICS

(75) Inventor: Theodore Alekel, Portland, OR (US)

(73) Assignee: Deep Photonics Corporation, Vancouver, WA (US)

(*) Notice: Subject to any disclaimer, the term of this patent is extended or adjusted under 35 U.S.C. 154(b) by 181 days.

(21) Appl. No.: 11/818,833

(22) Filed: Jun. 15, 2007

(65) Prior Publication Data
US 2008/0014135 A1 Jan. 17, 2008

Related U.S. Application Data

(63) Continuation-in-part of application No. 11/107,367, filed on Apr. 14, 2005, now abandoned.

(60) Provisional application No. 60/562,881, filed on Apr. 16, 2004.

(51) Int. Cl.
C01B 35/12 (2006.01)
C01F 17/00 (2006.01)
C01F 7/02 (2006.01)
C09K 11/80 (2006.01)

(52) U.S. Cl. ........... 252/301.4 R; 252/584; 117/950; 423/263

(58) Field of Classification Search .......... 423/263; 252/301.4 R, 584; 117/950, 73.3
See application file for complete search history.

(56) References Cited

U.S. PATENT DOCUMENTS

| | | | |
|---|---|---|---|
| 3,057,677 A | * | 10/1962 | Ballman .......... 423/263 |
| 4,231,838 A | | 11/1980 | Gier |
| 4,791,927 A | | 12/1988 | Menger |
| 4,826,283 A | | 5/1989 | Chuangtian et al. |
| 5,030,851 A | | 7/1991 | Unternahrer et al. |
| 5,043,308 A | | 8/1991 | Luetkens, Jr. et al. |
| 5,130,996 A | | 7/1992 | Amano et al. |
| 5,202,891 A | | 4/1993 | Sleight et al. |
| 5,684,813 A | | 11/1997 | Keszler |
| 5,879,803 A | | 3/1999 | Masaki et al. |
| 6,238,593 B1 | | 5/2001 | Huguenin et al. |
| 6,419,855 B1 | | 7/2002 | Keszler et al. |
| 2004/0060501 A1 | | 4/2004 | Thomas et al. |
| 2005/0247918 A1 | | 11/2005 | Keszler et al. |

(Continued)

FOREIGN PATENT DOCUMENTS

CN 1298217 A 6/2001

OTHER PUBLICATIONS

Chem. Abstract citation 1976:534678, "Entrance of impurites into yttrium aluminum borate crystals" Leonyuk et al, Izvestiya Akademii Nauk SSSR, Neorganicheskie, 12(7).*

(Continued)

Primary Examiner — Carol M Koslow
(74) Attorney, Agent, or Firm — Kilpatrick Townsend & Stockton LLP

(57) ABSTRACT

A compound for non-linear optics for use at 350 nm and below. The compound includes a material for non-linear optics comprising $A_xM_{(1-x)}Al_3B_4O_{12}$. x is larger than or equal to zero and smaller than or equal to 0.1, A is selected from a group consisting of Sc, Y, La, Yb, and Lu, and M is selected from a group consisting of Sc, Y, La, Yb, and Lu. The compound is free from a molybdenum bearing impurity of at least 1000 parts per million.

19 Claims, 4 Drawing Sheets

U.S. PATENT DOCUMENTS

| | | |
|---|---|---|
| 2006/0054864 A1 | 3/2006 | Alekel et al. |
| 2008/0014135 A1 | 1/2008 | Alekel |
| 2008/0043787 A1* | 2/2008 | Keszler et al. ............ 372/22 |

OTHER PUBLICATIONS

A. D. Mills, "Cryallographic Data for New Rare Earty Borate Compounds RX3(BO3)4", Inorg. Chem. 1(4), 1962, pp. 960-961.*

Leonyuk et al, "Growth and Characterization of RM3(BO3)4 Crystals", Prog. Crystal Growth and Charact. vol. 31, 1995, pp. 179-262.*

Jung et al, "Phase Transition of Neodymium Yttrium Aluminum Borate With Composition", Materials Research Bull., vol. 31, #8, pp. 1021-1027, 1996.*

Duffy, "The Optical Basicity and UV Absorption Spectra pf Lead Metasilicate and Lead Monoxide", Journ. Non-Crystal Solid, 76, 1985, pp. 391-397.*

PbO Transmission Graph—no date.*

Keszler, "Borates for optical frequency conversion," Current Opinion in Solid State and Materials Science, vol. 1, Issue 2, Apr. 1996, pp. 204-211.

Meyn et al., "Spectroscopic Properties and Efficient Diode-Pumped Laser. Operation of Neodymium-Doped Lanthanum Scandium Borate," IEEE Journal of Quantum Electronics, vol. 30, Issue 4, Apr. 1994, pp. 913-917.

Ostroumov et al., "Crystal Growth, Spectroscopic and Laser Characterization of Nd:CSB Crystals," Journal of Luminescence, vols. 72-74, Jun. 1997, pp. 826-828.

Peterson, "Huntite Crystals for UV Nonlinear Optics and Self-Doubled Lasers," [abstract], retrieved from the Internet <<http://www.dodsbir.net/selections/abs011/bmdoabs011.htm>>, 1 page total.

Peterson, "Studies on New Inorganic Solid-State Borates and Oxoanion Fluorides," [Thesis submitted to Oregon State University], dated Jun. 10, 1999, 184 pages total.

Ye et al., "Growth of nonlinear optical crystal $Y_{0.57}La_{0.72}Sc_{2.71}(BO_3)_4$," Journal of Crystal Growth, vol. 292, Issue 2, Jul. 1, 2006, pp. 464-467.

Ye et al., "Nonlinear Optical Crystal $Y_xLa_ySc_z(BO_3)_4$ (x + y + z = 4)," Chem. Mater., vol. 17 Issue 10, Apr. 2005, pp. 2687-2692.

Dekker et al., "2.27-W Q-switched self-doubling Yb:YAB laser with controllable pulse length," J. Opt. Soc. Am. B, 2005; 22(2):378-384.

Dekker et al., "Continuous wave and Q-switched diode-pumped neodymium, lutetium: yttrium aluminium borate lasers," Optics Communications, Jun. 1998.

Lu et al., "Excited emission and self-frequency-doubling effect of $Nd_xY1-xAl3 (BO3)4$ crystal," Chinese Phys. Lett. 1986; 3(9):413-416.

Beregi E. et al., "Growth and Morphology of $Nd^{3+}$, $Er^{3+}$ and $Cr^{3+}$ doped $YAl_3(BO_3)_4$ Single Crystals", Cryst. Res. Technol., 34(5-6):641-645,1999.

Brenier A., "Tunable coherent infrared generation near 2.5 μm from self-difference frequency mixing in $YAl_3(BO_3)_4:Nd^{3+}$", Applied Optics 43(32):60076010, 2004.

Chen C. et al., "Recent Advance in Nonlinear Optical and Electro-Optical Materials", Ann. Rev. Mater. Sci. 16:203-43, 1986.

Durmanov S. T. et al., Binary rare-earth scandium borates for diode-pumped lasers, Optical Materials 18:243-284, 2001.

Fielgeson R. S. et al., "Search of New Nonlinear Optical Materials", Center for Nonlinear Optical Materials Annual Report 1994-1995, http://replay.waybackmachine.org/19991002053631/http://www.stanfor.edu/group/CNOM/AnnualReport95/SecC/C.3.pdf.

Gruber J. et al., "Spectroscopic properties of nonlinear $NdSc_3(BO_3)_4$", Journal of Applied Physics 87(10):7159-7163, May 15, 2000.

Jia G et al., "Growth and Thermal and Spectral Properties of a New Nonlinear Optical Crystal$TmAl_3(BO_3)_4$", Crystal Growth & Design 5(3):949-952, 2005.

Jung et al., "Phase Transition of Neodymium Yttrium Aluminum Borate With Composition", Materials Research Bulletin 31(8):1021-1027, 1996.

Kellendonk F. et al., "On the luminescence of bismuth, cerium, and chromium and yttrium aluminium borate", J. Chem. Phys. 76(3)1194-1201, 1982.

Koporulina E. V. et al., "Flux growth of $(Y,RE)Al_3(BO_3)_4$ solid solutions (RE = Nd, Gd, Ho, Yb, Lu)", Journal of Crystal Growth 211:491-496, 2000.

Kuz'min O.V. et al., "Cerium scandium borate—an active nonlinear medium for diode-pumped lasers", Quantum Electronics 28(1) 50-54, 1998.

Leonyuk N.I. et al., "Growth and Characterization of $RM3(BO_3)_4$ Crystals", Prog. Crystal Growth and Charact. 31:179-278, 1995.

Li J., et al., "The influence of $Yb^{3+}$ concentration on $Yb:YAl_3(BO_3)_4$", Cryst. Res. Technol. 38(10):890-895, 2003.

Matthews S., "The power in crystals", Laser Focus World, Mar. 2003.

Nikolov V. et al., "A new solvent for the growth of $Y_{1-x}Nd_xAl_3(BO_3)_4$ single crystals from high-temperature solutions" Journal of Crystal Growth 144:187-192, 1994.

Peterson G. A. et al., "Trigonal Huntite Borate $CeSc_3(BO_3)_4(CSB)$", To be submitted to Journal of Solid-State Chemistry.

Peterson G. A. et al., "Stoichiometric, trigonal huntite borate $CeSc_3(BO_3)_4$", International Journal of Inorganic Materials 2:101-106, 2000.

Wang P. et al., "Growth and evaluation of ytterbium-doped yttrium aluminum borate as a potential self-doubling laser crystal", Optical Society of America, 16(1):63-69, 1999.

* cited by examiner

METHOD AND STRUCTURE FOR NON-LINEAR OPTICS

CROSS-REFERENCES TO RELATED APPLICATIONS

This application is a continuation-in-part of U.S. application Ser. No. 11/107,367, filed Apr. 14, 2005, now abandoned, which claims priority to U.S. Provisional Application No. 60/562,881 filed Apr. 16, 2004. U.S. Provisional Application No. 60/562,881 is incorporated by reference herein. U.S. Provisional Application No. 60/562,626 is not incorporated by reference.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates generally to certain compounds having optical properties. More particularly, as an example, the invention provides a specific compound comprising $A_xM_{(1-x)}Al_3B_4O_{12}$ for use with selected wavelengths of electromagnetic radiation. x is larger than or equal to zero and smaller than or equal to 0.1, A is selected from a group consisting of Sc, Y, La, Yb, and Lu, and M is selected from a group consisting of Sc, Y, La, Yb, and Lu. Merely by way of example, the compound is useful for electromagnetic radiation having a wavelength of 350 nm and less, but it would be recognized that the invention has a much broader range of applicability.

Nonlinear optical (NLO) materials are unusual in that they affect the properties of light. A well-known example is the polarization of light by certain materials, such as when materials rotate the polarization vectors of absorbed light. If the effect on the polarization vector by the absorbed light is linear, then light emitted by the material has the same frequency as the absorbed light. NLO materials affect the polarization vector of the absorbed light in a nonlinear manner. As a result, the frequency of the light emitted by a nonlinear optical material is affected.

For example, when a beam of coherent light of a given frequency, such as produced by a laser, propagates through a properly oriented NLO crystal having non-zero components of the second order polarizability tensor, the crystal will generate light at a different frequency, thus extending the useful frequency range of the laser. Generation of this light can be ascribed to processes such as sum-frequency generation (SFG), difference-frequency generation (DFG) and optical parametric amplification (OPA). Devices using NLO crystals include, but are not limited to up and down frequency converters, optical parametric oscillators, optical rectifiers, and optical switches.

Frequency generation in NLO materials is usually an important effect. For example, two monochromatic electromagnetic waves with frequencies $\omega_1$ and $\omega_2$ propagating through a properly oriented NLO crystal can result in generation of light at a variety of frequencies. Mechanisms defining the frequency of light using these two separate frequencies are sum-frequency generation (SFG) and difference-frequency generation (DFG). SFG is a process where light of frequency $\omega_3$ is generated as the sum of the two incident frequencies, $\omega_3=\omega_1+\omega_2$. In other words, SFG is useful for converting long wavelength light to shorter wavelength light (e.g. near infrared to visible, or visible to ultraviolet). A special case of sum-frequency generation is second-harmonic generation (SHG) where $\omega_3=2\omega_1$, which is satisfied when the incident frequencies are equal, $\omega_1=\omega_2$. DFG is a process where light of frequency $\omega_4$ is generated as the difference of the incident frequencies $\omega_4=\omega_1-\omega_2$. DFG is useful for converting shorter wavelength light to longer wavelength light (e.g. visible to infrared). A special case of DFG is when $\omega_1=\omega_2$, hence $\omega_4=0$, which is known as optical rectification. Optical parametric oscillation (OPO) is also a form of DFG and is used to produce light at tunable frequencies.

The conversion efficiency of an NLO crystal for a particular application is dependent on a number of factors that include, but are not limited to: the effective nonlinearity of the crystal (picometers/volt [pm/V]), birefringence (Δn, where n is a refractive index), phase-matching conditions (Type I, Type II, non-critical, quasi, or critical), angular acceptance angle (radian-cm), temperature acceptance (.degree. K-cm), walk-off (radian), temperature dependent change in refractive index (dn/dT), optical transparency range (nm), and the optical damage threshold ($W/cm^2$). Desirable NLO crystals should posses an optimum combination of the above properties as defined by the specific application.

Borate crystals form a large group of inorganic NLO materials used in various applications, such as laser-based manufacturing, medicine, hardware and instrumentation, communications, and research studies. Beta barium borate (BBO: $\beta$-$BaB_2O_4$), lithium triborate (LBO: $LiB_3O_5$), and cesium lithium borate (CLBO: $CsLi(B_3O_5)_2$) are examples of borate-based NLO crystals developed in recent years that are being used widely as NLO devices, especially in high power applications. Select properties suitable for generation of laser light from the mid-infrared to the ultraviolet for these crystals are listed in Table 1.

TABLE 1

Commercially Available NLO Materials and Properties

| PROPERTY | BBO | LBO | CLBO |
|---|---|---|---|
| $D_{eff}$ (pm/V) | 2.2 | 0.8 | 0.9 |
| Optical Transmission (nm) | 190-3500 | 160-2600 | 180-2750 |
| Angular Acceptance (mrad-cm) | 0.8 | 6.5 | 0.6 |
| Temperature Acceptance (K-cm) | 55 | 7.5 | 2.5 |
| Walk-off Angle (deg.) | 3 | 0.6 | 1.8 |
| Damage Threshold ($GW/cm^2$) | 5 | 10 | 10 |
| Crystal Growth Properties | flux or congr. | flux | congruent |

BBO has a favorable non-linearity (about 2.2 pm/V), transparency between 190 nm and 3500 nm, significant birefringence (necessary for phase matching), and a high damage threshold (5 $GW/cm^2$, 1064 nm, 0.1 ns pulse width). However, its high birefringence creates a relatively small angular acceptance that can limit conversion efficiencies and laser beam quality. The crystal is relatively difficult to grow to large sizes and is somewhat hygroscopic.

LBO exhibits optical transparency throughout the visible electromagnetic spectrum, extending well into the ultraviolet (absorption edge.congruent. 160 nm), and possesses a high damage threshold (10 $GW/cm^2$, 1064 nm, 0.1 ns pulse width). However, it has insufficient intrinsic birefringence for phase matching to generate deep UV radiation. Furthermore, LBO melts incongruently and must be prepared by flux-assisted crystal growth methods. This limits production efficiency that leads to small crystals and higher production costs.

CLBO appears capable of producing UV light due to a combination of high nonlinearity and sufficient birefringence. The crystal can also be manufactured to relatively large dimensions. However, the crystal usually is exceedingly moisture sensitive and often invariably sorbs water from the air; hence, extreme care usually must be taken to manage environmental moisture to prevent hydration stresses and possible crystal destruction.

In 1981 a crystal called NYAB [$Nd_xY_{(1-x)}Al_3B_4O_{12}$] was reported in the USSR. A laser self-frequency-doubling effect from 1320 nm to 660 nm was realized in a $Nd_{0.2}Y_{0.8}Al_3B_4O_{12}$ crystal, but it was found that intrinsic crystal absorption at the second harmonic limited practical use of laser self-frequency-doubling from 1060 nm to 530 nm.

Years later several institutes in China succeeded in improving the crystal growing process and obtained NYAB crystals of good optical quality and reasonable size. Lu et al. developed a multi-functional crystal $Nd_xY_{(1-x)}Al_3B_4O_{12}$ with effective laser self-frequency-doubling conversion. The $Nd^{3+}$ doped laser gain crystal was pumped with a dye laser, with laser emission at 1060 nm that was then converted to 530 nm within itself (see FIG. 2 of Lu et al., *Chinese Phys. Lett.* Vol. 3, No. 9 (1986)). NYAB has since been used as a research crystal that often is useful only in the visible spectrum. Recent work with Yb-doped YAB as a self-doubling laser gain material follows the same path as NYAB with small alterations in operational laser efficiency and wavelengths. Laser light is generated within the crystal and self-doubled into green 520 nm. (see Dekker et al., *JOSA B*, Vol. 22, No. 2 (2005) 378-384). Again, its operation and the historic method of preparation limit its use to the visible and infrared. Hence, it is highly desirable to improve techniques for this family of compounds that enable optical function down into the ultraviolet.

Hence, it is highly desirable to improve techniques for optical compounds.

BRIEF SUMMARY OF THE INVENTION

The present invention relates generally to certain compounds having optical properties. More particularly, as an example, the invention provides a specific compound comprising $A_xM_{(1-x)}Al_3B_4O_{12}$ for use with selected wavelengths of electromagnetic radiation. x is larger than or equal to zero and smaller than or equal to 0.1, A is selected from a group consisting of Sc, Y, La, Yb, and Lu, and M is selected from a group consisting of Sc, Y, La, Yb, and Lu. Merely by way of example, the compound is useful for electromagnetic radiation having a wavelength of 350 nm and less, but it would be recognized that the invention has a much broader range of applicability.

According to one embodiment of the present invention, a compound for non-linear optics for use at 350 nm and below is provided. The compound includes a material for non-linear optics comprising $YAl_3B_4O_{12}$. The compound is free from a molybdenum-bearing impurity of at least 1000 parts per million.

According to yet another embodiment of the present invention, a compound for non-linear optics for use at 350 nm and below comprising a material for non-linear optics includes $Y_{(1-x)}M_xAl_3B_4O_{12}$. x is larger than or equal to zero and smaller than or equal to 0.1, and M is selected from a group consisting of Sc, La, Yb, and Lu. The compound is free from a molybdenum bearing impurity of at least 1000 parts per million.

According to yet another embodiment of the present invention, a compound for non-linear optics for use at 350 nm and below comprising a material for non-linear optics includes $Yb_{(1-x)}M_xAl_3B_4O_{12}$. x is larger than or equal to zero and smaller than or equal to 0.1, and M is selected from a group consisting of Sc, Y, La, and Lu. The compound is free from a molybdenum bearing impurity of at least 1000 parts per million.

According to yet another embodiment of the present invention, a compound for non-linear optics for use at 350 nm and below comprising a material for non-linear optics includes $Lu_{(1-x)}M_xAl_3B_4O_{12}$. x is larger than or equal to zero and smaller than or equal to 0.1, and M is selected from a group consisting of Sc, Y, Yb, and La. The compound is free from a molybdenum bearing impurity of at least 1000 parts per million.

According to yet another embodiment of the present invention, a compound for non-linear optics for use at 350 nm and below comprising a material for non-linear optics includes $Sc_{(1-x)}M_xAl_3B_4O_{12}$. x is larger than or equal to zero and smaller than or equal to 0.1, and M is selected from a group consisting of Y, La, Yb, and Lu. The compound is free from a molybdenum bearing impurity of at least 1000 parts per million.

According to yet another embodiment of the present invention, a compound for non-linear optics for use at 350 nm and below comprising a material for non-linear optics includes $A_xM_{(1-x)}Al_3B_4O_2$. x is larger than or equal to zero and smaller than or equal to 0.1, A is selected from a group consisting of Sc, Y, La, Yb, and Lu, and M is selected from a group consisting of Sc, Y, La, Yb, and Lu. The compound is free from a molybdenum bearing impurity of at least 1000 parts per million.

According to yet another embodiment of the present invention, a method for making a compound for non-linear optics for use at 350 nm and below includes providing a plurality of materials. The plurality of materials includes a lanthanum bearing compound, and the lanthanum bearing compound is capable of being decomposed into at least lanthanum oxide upon heating. Additionally, the method includes mixing the plurality of materials to form a mixture based on at least information associated with a predetermined proportion, starting a crystallization process in the mixture to form a crystal, and removing the crystal from the mixture, the crystal including lanthanum.

According to yet another embodiment of the present invention, a method for making a compound for non-linear optics for use at 350 nm and below includes providing a plurality of materials. The plurality of materials includes an yttrium bearing compound, and the yttrium bearing compound is capable of being decomposed into at least yttrium oxide upon heating. Additionally, the method includes mixing the plurality of materials to form a mixture based on at least information associated with a predetermined proportion, starting a crystallization process in the mixture to form a crystal, and removing the crystal from the mixture, the crystal including yttrium.

Many benefits are achieved by way of the present invention over conventional techniques. For example, some embodiments of the present invention provide new methods of preparation that exclude contaminants that preclude the operation of borate huntites in the ultraviolet spectrum. In addition, a preparative method has been developed to allow rapid formation of crystal by using an inventive chemical recipe. Such methods enable the manufacture of large single crystals of the present invention, heretofore unattained in conventional methods. Also, a preparative method has been developed with a lower volatility of the starting mixture when heated to a melting temperature than conventional methods.

Various additional objects, features and advantages of the present invention can be more fully appreciated with reference to the detailed description and the accompanying drawings that follow.

DETAILED DESCRIPTION OF THE INVENTION

Figure 1:
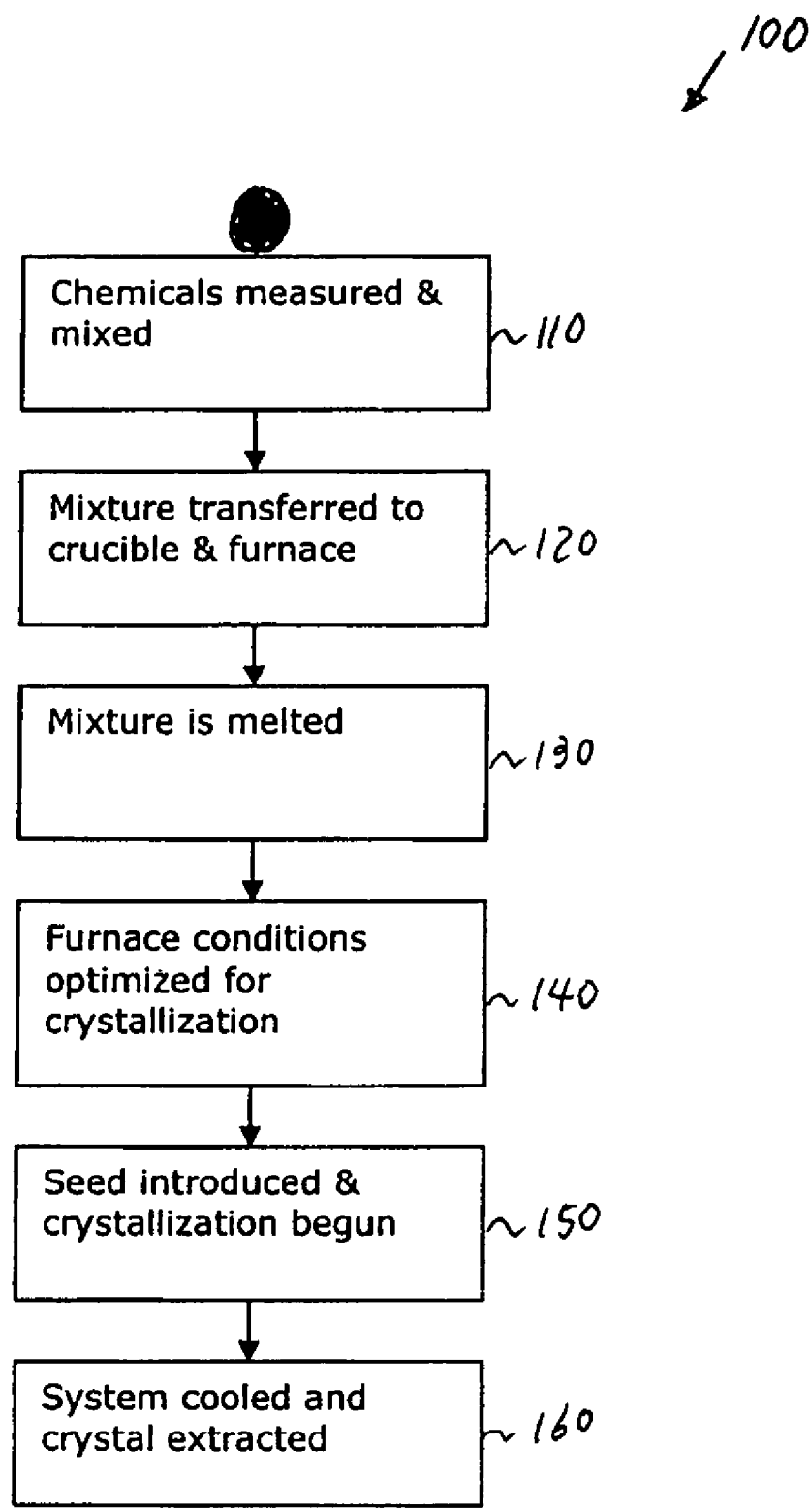
FIG. 1 is a simplified method for making optical compound according to an embodiment of the present invention.

The present invention relates generally to certain compounds having optical properties. More particularly, as an example, the invention provides a specific compound comprising $A_xM_{(1-x)}Al_3B_4O_{12}$ for use with selected wavelengths of electromagnetic radiation. x is larger than or equal to zero and smaller than or equal to 0.1, A is selected from a group consisting of Sc, Y, La, Yb, and Lu, and M is selected from a group consisting of Sc, Y, La, Yb, and Lu. Merely by way of example, the compound is useful for electromagnetic radiation having a wavelength of 350 nm and less, but it would be recognized that the invention has a much broader range of applicability.

NYAB was developed as a self-doubling crystal, i.e., a crystal that is optically pumped and generates the fundamental wavelength and its second harmonic without the need of a separate frequency doubling crystal. However, due to inherent limitations, the possible applications are drastically limited. First, the fundamental wavelength often can only be 1060 nm and 1300 nm. Second, since the crystals usually are only a few millimeters in size, they are often not available in adequately large crystal sizes convenient for commercial use in products.

While NYAB may have been made commercially available from time-to-time in limited quantities, the pure form of YAB has not been commercially produced. The conventional method of production yields small crystal that contains a significant amount of nonstoichiometric metals contamination and exhibits substandard crystal quality. Moreover, the fluxing agent(s) used in conventional methods introduce a considerable amount of contaminant that prevents effective device operation in the UV below 350 nm.

According to certain embodiments of the present invention, several kinds of borate crystals containing one or more kinds of metal ions of a rare earth metal and the like were prepared, and an occurrence experiment of double harmonic (wavelength: 266 nm) was carried out by irradiating frequency doubled Nd:YAG laser (wavelength: 532 nm) onto these borate crystals. Thereby, the ability to experimentally make NLO materials was demonstrated that produce harmonic light below 350 nm. As a result, strong generation of second harmonic 266 nm from borate crystals was found that includes both Y and Al, and a novel NLO crystal in the form of yttrium aluminum borate was achieved capable of transmitting and producing ultraviolet radiation below 350 nm.

It is an object of certain embodiments of the present invention to produce and utilize nonlinear optical materials that satisfy $Y_{(1-x)}M_xAl_3B_4O_{12}$, where M=Sc, La, Yb, or Lu, and $0 \leq x \leq 0.1$, and manufactured by a method that eliminates or significantly reduces contaminants that prohibit device use in the UV spectrum. More specifically, some embodiments of the present invention substantially exclude metals, such as those of Group 6, from being present in the device so as to be useful in the UV below 350 nm.

It is an object of some embodiments of the present invention to provide methods for making nonlinear optical materials that satisfy the above composition without the deleterious UV absorption. One embodiment comprises forming a mixture comprising from about 10 to about 30 mol % of a source of Y, from about 10 to about 40 mol % of M, from about 15 to about 40 mol % of a source of Al, and from about 25 to about 50 mol % of boron oxide. If M is Sc, then the source of M generally is scandium oxide; if M is La, then the source of M generally is lanthanum oxide; if M is Yb, then the source of M generally is ytterbium oxide; if M is Lu, then the source of M generally is lutetium oxide. The mixture is heated to a temperature and for a period of time sufficient to form the NLO material. For instance, the step of heating may comprise heating the mixture to a first temperature of at least 850 K, and generally greater than about 850 K. The mixture is then cooled. After cooling the mixture is comminuted (ground to a fine powder, such as by grinding with a mortar and pestle), and then heated to a second temperature of at least 1300 K, generally greater than about 1300 K.

Another method to form these crystalline materials may be but not limited to top-seeded solution growth as shown in FIG. 1. The method includes the following processes:
1. High purity oxide powders and chemicals are measured and mixed in appropriate proportions.
2. The mixture is loaded in a crucible and placed in a furnace.
3. The mixture is heated and caused to melt into a liquid.
4. After a time, melt temperature is brought near to its freezing point.
5. A cold finger material or a seed crystal is introduced to initiate crystallization.
6. Melt temperature and apparatus conditions are modified and monitored to encourage crystal growth.
7. When appropriate, the system is brought down to room temperature.
8. The crystal is removed from the system.

For example, the synthesis of $(Y,La)Al_3B_4O_{12}$ may be performed as follows. Yttrium oxide ($Y_2O_3$), having a purity of greater than 99.9%, lanthanum oxide ($La_2O_3$), having a purity of greater than 99.9%, aluminum oxide ($Al_2O_3$), having a purity greater than 99.9%, and boron oxide ($B_2O_3$), having a purity of greater than 99.9% were purchased from commercial vendors such as Aesar and Stanford Materials. A mixture was formed including about 14 wt % yttrium oxide, about 30 wt % lanthanum oxide, about 19 wt % aluminum oxide, and about 37 wt % boron oxide.

As discussed above, certain embodiments of the present invention is related to nonlinear optical (NLO) devices and electrooptic devices and the ability to employ such devices below 350 nm. Some embodiments of the present invention are related to nonlinear optical materials that satisfy the general formula $Y_{(1-x)}M_xAl_3B_4O_{12}$ (M=Sc, La, or Lu and $0 \leq x \leq 0.1$ mol %) and are prepared without contaminants that prevent use in the ultraviolet (UV) section of the electromagnetic spectrum.

According to some embodiments of the present invention, the nonlinear optical material $Y_{(1-x)}M_xAl_3B_4O_{12}$ (M=Sc, La, or Lu, and $0 \leq x \leq 0.1$) is used for an NLO device for operation below 350 nm. In another example, the nonlinear optical material is used with a laser source for a device that generates optical radiation below 350 nm. In yet another example, the nonlinear optical material is used with a light source for a device that generates optical radiation below 350 nm. In yet another example, the nonlinear optical material is formed in the trigonal crystal class for use below 350 nm. In yet another example, the nonlinear optical material is formed in the space group R32 for use below 350 nm.

In certain embodiments of the present invention, the nonlinear optical material satisfies $Yb_{(1-x)}M_xAl_3B_4O_{12}$ (M=Sc, La, or Lu, and $0 \leq x \leq 0.1$) or $Lu_{(1-x)}M_xAl_4O_{12}$ (M=Sc, La, or Lu, and $0 \leq x \leq 0.1$). In some embodiments, the nonlinear optical material $Y_{(1-x)}M_xAl_3B_4O_{12}$, $Yb_{(1-x)}M_xAl_3B_4O_{12}$, or $Lu_{(1-x)}M_xAl_3B_4O_{12}$ is doped by Ce and/or Nd. In certain embodiments, the nonlinear optical material $Y_{(1-x)}M_xAl_3B_4O_{12}$ or $Lu_{(1-x)}M_xAl_3B_4O_{12}$ is doped by Ce, Nd, and/or Yb.

As discussed above, while NYAB may be available in limited quantities, the pure form of YAB has not been commercially produced. The conventional method of production yields small crystal that contains a large amount of nonstoichiometric metals contamination and exhibits substandard crystal quality. Moreover, the solvent used introduces a considerable amount of contaminant that prevents device operation in the UV below 350 nm. The summary of work on huntite borates by Leonyuk & Leonyuk (1995) described a flux system that has subsequently remained as a method of producing YAB and its family members, namely the potassium molybdates $K_2MoO_4$ and $K_2Mo_3O_{10}$. Unfortunately, these solvent formulations possess severe limitations for large scale crystal growth: a) high flux volatility, b) small crystal yield, and c) significant inclusion of Mo atoms into the target borate huntite structure. Thus, neither has commercial crystal production of pure YAB come about nor has the NLO crystal been adopted into laser products.

It is an object of certain embodiments of the present invention to produce and utilize nonlinear optical materials that satisfy $A_xM_{(1-x)}Al_3B_4O_{12}$ where $0 \leq x \leq 0.1$, A=(Sc, Y, La, Yb, Lu), M=(Sc, Y, La, Yb, Lu), and manufactured by a method that eliminates or significantly reduces contaminants that prohibit device use in the UV spectrum. More specifically, some embodiments of the present invention substantially exclude metals, such as those of Group 6, from being present in the device so as to be useful in the UV below 350 nm. Avoiding the inclusion of Group 6 impurities, such as Mo, extends the UV transmission of select borate huntites. In addition, the absence of superfluous metals in the primary crystal composition reduces the overall bulk spectral absorption over its entire transparency range, such as from 165 to 2700 nm. With the embodiments described herein, the intrinsic transparency may be realized, heretofore unknown and uncharacterized in the scientific community.

As discussed above, it is an object of some embodiments of the present invention to provide methods for making nonlinear optical materials that satisfy $A_xM_{(1-x)}Al_3B_4O_{12}$ where $0 \leq x \leq 0.1$, A=(Sc, Y, La, Yb, Lu), M=(Sc, Y, La, Yb, Lu) without the deleterious UV absorption. One embodiment comprises forming a mixture comprising from about 10 to about 30 mol % of a source of A, from about 10 to about 40 mol % of M, from about 15 to about 40 mol % of a source of Al, and from about 25 to about 50 mol % of boron oxide. If A or M is Sc, then the source of A or M generally is scandium oxide; if A or M is Y, then the source of A or M generally is yttrium oxide; if A or M is La, then the source of A or M generally is lanthanum oxide; if A or M is Yb, then the source of A or M generally is ytterbium oxide; if A or M is Lu, then the source of A or M generally is lutetium oxide. The mixture is heated to a temperature and for a period of time sufficient to form the NLO material. For instance, the step of heating may comprise heating the mixture to a first temperature of at least 850 K, and generally greater than about 850 K. The mixture is then cooled. After cooling the mixture is comminuted (ground to a fine powder, such as by grinding with a mortar and pestle), and then heated to a second temperature of at least 1300 K, generally greater than about 1300 K.

As discussed above, FIG. 1 is a simplified method for making optical compound according to an embodiment of the present invention. This diagram is merely an example, which should not unduly limit the scope of the claims. One of ordinary skill in the art would recognize many variations, alternatives, and modifications. The method 100 includes a process 110 for measuring and mixing chemicals, a process 120 for transferring mixture to crucible and furnace, a process 130 for melting mixture, a process 140 optimizing furnace conditions for crystallization, a process 150 for introducing seed and starting crystallization, and a process 160 for cooling system and extracting crystal. Although the above has been shown using a selected sequence of processes, there can be many alternatives, modifications, and variations. For example, some of the processes may be expanded and/or combined. Other processes may be inserted to those noted above. Depending upon the embodiment, the specific sequence of processes may be interchanged with others replaced. For example, the process 150 is modified to use spontaneous nucleation, or use conventional optical crystal growth procedures to introduce a cold finger to the melt surface. Further details of these processes are found throughout the present specification and more particularly below.

At the process 110, certain chemicals are measured and mixed. For example, high purity oxide powders and chemicals are measured and mixed in appropriate proportions. At the process 120, the mixture is transferred to crucible and furnace. For example, the mixture is loaded in a crucible and placed in a furnace. At the process 130, the mixture is melted. For example, the mixture is heated and caused to melt into a liquid.

At the process 140, furnace conditions are optimized for crystallization. For example, after a time, the melt temperature is brought near to its freezing point. At the process 150, a seed is introduced and the crystallization is started. For example, a seed crystal is introduced to initiate crystallization. In another example, the process 150 is modified to use a cold finger material to initiate crystallization. In yet another example, the process 150 is modified to use spontaneous nucleation to initiate crystallization. Additionally, the melt temperature and apparatus conditions are modified and monitored to encourage crystal growth. At the process 160, the system is cooled and the crystal is extracted. For example, when appropriate, the system is brought down to room temperature. The crystal is removed from the system and ready for tests or further processing.

As an example for the method 100, the synthesis of $Y_{(1-x)}La_xAl_3B_4O_{12}$, where $0 \leq x \leq 0.1$ is performed as follows:

At the process 110, yttrium oxide ($Y_2O_3$), having a purity of greater than 99.9%, lanthanum oxide ($La_2O_3$), having a purity of greater than 99.9%, aluminum oxide ($Al_2O_3$), having a purity greater than 99.9%, and boron oxide ($B_2O_3$), having a purity of greater than 99.9% are obtained. For example, these chemicals are acquired from commercial vendors such as Aesar and Stanford Materials. A mixture is formed including about 14 wt % $Y_2O_3$, about 30 wt % $La_2O_3$, about 19 wt % $Al_2O_3$, and about 37 wt % $B_2O_3$.

At the process 120, the mixture is loaded into a crucible and placed in a high-temperature furnace with atmospheric environment control. For example, either ambient or an inert atmosphere is satisfactory. At the process 130, the mixture is heated in 12 hours from room temperature to another temperature ranging from 1450 to 1575 K. The resulting melt is allowed to soak at another temperature for about 1 to 3 days.

At the process 140, the liquid mixture is cooled at a rate of 20 K/hour to a temperature near its freezing point. For example, the temperature ranges from about 1475 to 1400 K. At the temperature, the mixture is held for about 8 hours. At the process 150, by spontaneous nucleation, or by using conventional optical crystal growth procedures to introduce a crystalline seed or cold finger to the melt surface, the product begins to form while cooling to a final temperature of 1300 K at a rate of about 1-5 K/day. Additionally, during the course of the growth, the melt temperature and apparatus conditions are monitored and optionally modified to encourage crystal growth, either by an operator and/or by the automated control system on the furnace.

At the process 160, the system is then cooled to room temperature at a cooling rate of about 50 K/hour. Colorless, transparent crystal of $Y_{(1-x)}La_xAl_3B_4O_{12}$, where $0 \leq x \leq 0.1$, is obtained and removed from the furnace.

In yet another example for the method 100, the synthesis of $Lu_{(1-x)}La_xAl_3B_4O_{12}$, where $0 \leq x \leq 0.1$, is performed as follows:

At the process 110, lutetium oxide ($Lu_2O_3$), having a purity of greater than 99.9%, lanthanum oxide ($La_2O_3$), having a purity of greater than 99.9%, aluminum oxide ($Al_2O_3$), having a purity greater than 99.9%, and boron oxide ($B_2O_3$), having a purity of greater than 99.9% are obtained. For example, these chemicals are acquired from commercial vendors such as Aesar and Stanford Materials. A mixture is formed including about 21 wt % $Lu_2O_3$, about 30 wt % $La_2O_3$, about 16 wt % $Al_2O_3$, and about 34 wt % $B_2O_3$.

At the process 120, the mixture is loaded into a crucible and placed in a high-temperature furnace with atmospheric environment control of nitrogen with a partial pressure of oxygen, which is larger than or equal to 3000 ppm. At the process 130, the mixture is heated in 12 hours from room temperature to another temperature ranging from 1450 to 1575 K. The resulting melt is allowed to soak at another temperature for about 1 to 3 days.

At the process 140, the liquid mixture is cooled at a rate of 20 K/hour to a temperature near its freezing point. For example, the temperature ranges from about 1475 to 1400 K. At the temperature, the mixture is held for about 8 hours. At the process 150, by spontaneous nucleation, or by using conventional optical crystal growth procedures to introduce a crystalline seed or cold finger to the melt surface, the product begins to form while cooling to a final temperature of 1275 K at a rate of about 1-5 K/day. Additionally, during the course of the growth, the melt temperature and apparatus conditions are monitored and optionally modified to encourage crystal growth, either by an operator and/or by the automated control system on the furnace.

At the process 160, the system is then cooled to room temperature at a cooling rate of about 50 K/hour. Colorless, transparent crystal of $Lu_{(1-x)}La_xAl_3B_4O_{12}$, where $0 \leq x \leq 0.1$, is obtained and removed from the furnace.

In yet another example for the method 100, the synthesis of $Sc_{(1-x)}La_xAl_3B_4O_{12}$, where $0 \leq x \leq 0.1$, is performed as follows:

At the process 110, scandium oxide ($Sc_2O_3$), having a purity of greater than 99.9%, lanthanum oxide ($La_2O_3$), having a purity of greater than 99.9%, aluminum oxide ($Al_2O_3$), having a purity greater than 99.9%, and boron oxide ($B_2O_3$), having a purity of greater than 99.9% are obtained. For example, these chemicals are acquired from commercial vendors such as Aesar and Stanford Materials. A mixture is formed including about 8 wt % $Sc_2O_3$, about 34 wt % $La_2O_3$, about 18 wt % $Al_2O_3$, and about 39 wt % $B_2O_3$.

At the process 120, the mixture is loaded into a crucible and placed in a high-temperature furnace with atmospheric environment control. For example, either ambient or a nitrogen atmosphere is satisfactory. At the process 130, the mixture is heated in 12 hours from room temperature to another temperature ranging from 1475 to 1600 K. The resulting melt is allowed to soak at temperature for about 1 to 3 days.

At the process 140, the liquid mixture is cooled at a rate of 20 K/hour to a temperature near its freezing point. For example, the temperature ranges from about 1500 to 1425 K. At the temperature, the mixture is held for about 8 hours. At the process 150, by spontaneous nucleation, or by using conventional optical crystal growth procedures to introduce a crystalline seed or cold finger to the melt surface, the product begins to form while cooling to a final temperature of 1300 K at a rate of about 1-5 K/day. Additionally, during the course of the growth, the melt temperature and apparatus conditions are monitored and optionally modified to encourage crystal growth, either by an operator and/or by the automated control system on the furnace.

At the process 160, the system is then cooled to room temperature at a cooling rate of about 50 K/hour. Colorless, transparent crystal of $Sc_{(1-x)}La_xAl_3B_4O_{12}$, where $0 \leq x \leq 0.1$, is obtained and removed from the furnace.

Figure 2:
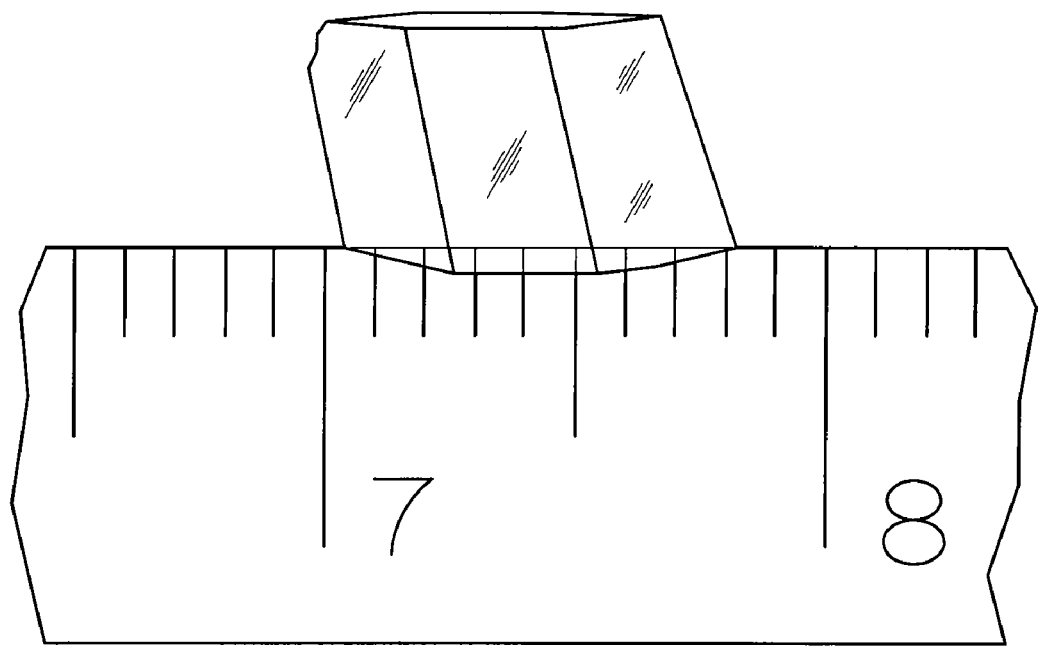
FIG. 2 is a simplified image for an optical compound according to an embodiment of the present invention.

FIG. 2 is a simplified image for an optical compound according to an embodiment of the present invention. This diagram is merely an example, which should not unduly limit the scope of the claims. One of ordinary skill in the art would recognize many variations, alternatives, and modifications. The optical compound includes $Y_xLa_yAl_3B_4O_{12}$, where $0 \leq x$, $0 \leq y$, and $x+y \leq 1$, made by the method 100 as discussed above. The synthesis starts with yttrium oxide ($Y_2O_3$), lanthanum oxide ($La_2O_3$), aluminum oxide ($Al_2O_3$), and boron oxide ($B_2O_3$). As shown in FIG. 2, the 6×6×7 mm crystal is sufficiently large and possesses optically-transparent faces that enable it to function in laser light modification device.

Figure 3:
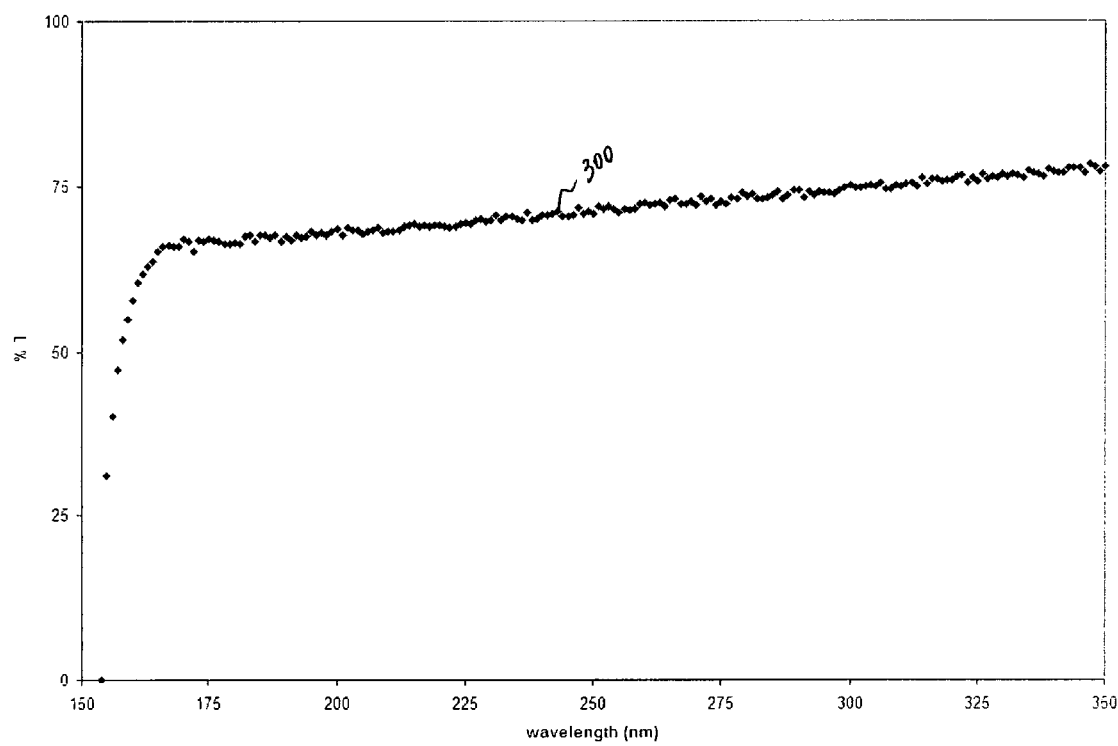
FIG. 3 is a simplified diagram showing transmission characteristics for an optical compound according to an embodiment of the present invention.

FIG. 3 is a simplified diagram showing transmission characteristics for an optical compound according to an embodiment of the present invention. This diagram is merely an example, which should not unduly limit the scope of the claims. One of ordinary skill in the art would recognize many variations, alternatives, and modifications. The optical compound includes $Y_{(1-x)}La_xAl_3B_4O_{12}$, where $0 \leq x \leq 0.1$, made by the method 100 as discussed above. The synthesis starts with yttrium oxide ($Y_2O_3$), lanthanum oxide ($La_2O_3$), aluminum oxide ($Al_2O_3$), and boron oxide ($B_2O_3$). As shown in FIG. 3, a curve 300 shows the transmission percentage as a function of wavelength. The transmission percentage remains relative constant from 350 nm to about 175 nm.

Figure 4:
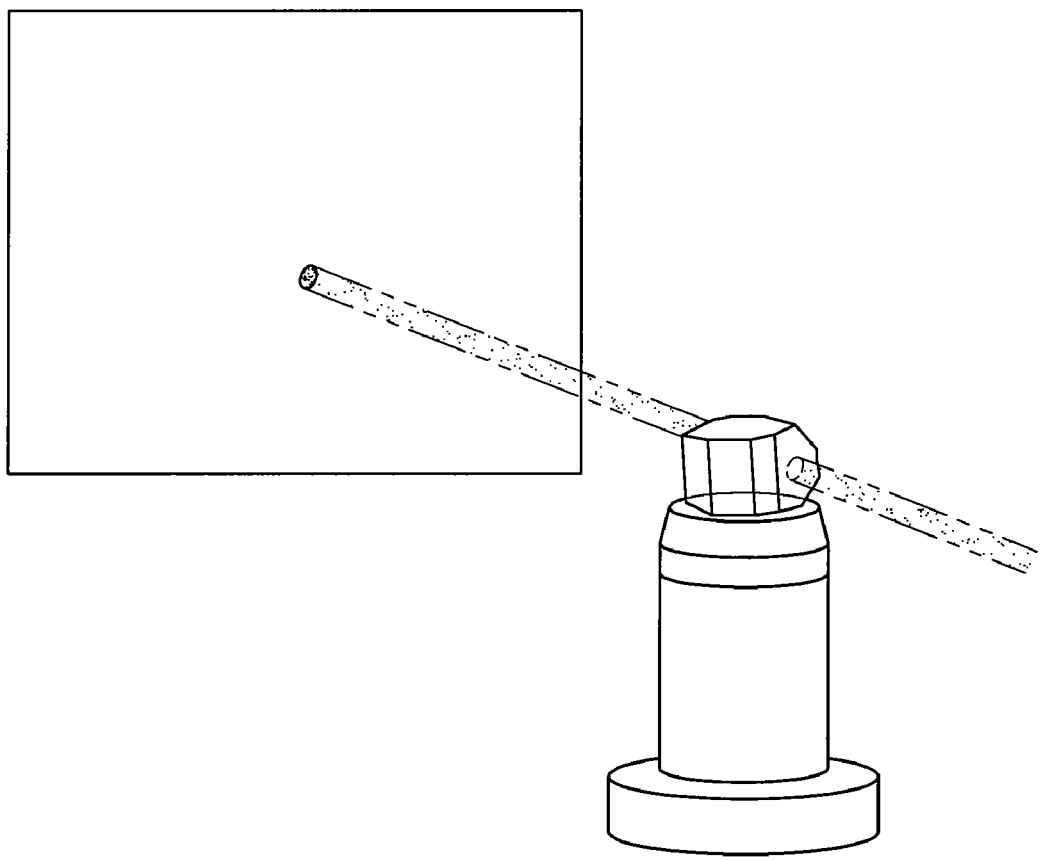
FIG. 4 is a simplified diagram showing frequency conversion by an optical compound according to an embodiment of the present invention.

FIG. 4 is a simplified diagram showing frequency conversion by an optical compound according to an embodiment of the present invention. This diagram is merely an example, which should not unduly limit the scope of the claims. One of ordinary skill in the art would recognize many variations, alternatives, and modifications. The optical compound includes $Y_{(1-x)}La_xAl_3B_4O_{12}$, where $0 \leq x \leq 0.1$, made by the method 100 as discussed above. The synthesis starts with yttrium oxide ($Y_2O_3$), lanthanum oxide ($La_2O_3$), aluminum oxide ($Al_2O_3$), and boron oxide ($B_2O_3$). For example, the optical compound is the crystal as shown in FIG. 2. During the experiment, laser pulses with a wavelength of about 532 nm were delivered to a 6-mm-by-6-mm-by-7-mm $Y_{(1-x)}La_xAl_3B_4O_{12}$ crystal. In response, the crystal output a light beam received by an imaging scintillator card, which was sensitive to ultraviolet radiation. As shown in FIG. 4, an image was taken using a camera that was made blind to 532 nm with a filter for the photograph. In the image, blue fluorescence was observed on the imaging scintillator card. Hence ultraviolet light was generated by the $Y_{(1-x)}La_xAl_3B_4O_{12}$ crystal through a SHG process and was detected by the imaging scintillator card. In another experiment, a dichroic mirror was specifically optimized for 266-nm light transmission and placed between the $Y_{(1-x)}La_xAl_3B_4O_{12}$ crystal and the imaging scintillator card. Blue fluorescence, which is similar to that in FIG. 4, was also observed. Hence ultraviolet light at 266 nm was generated by the $Y_{(1-x)}La_xAl_3B_4O_{12}$ crystal.

As discussed above, and further emphasized here, the method can be used to make various types of optical compounds. According to one embodiment of the present invention, a compound for non-linear optics for use at 350 nm and below is made by the method 100. The compound includes a material for non-linear optics comprising $YAl_3B_4O_{12}$. The compound is free from a molybdenum bearing impurity of at least 1000 parts per million. According to yet another embodiment of the present invention, a compound for non-linear optics for use at 350 nm and below is made by the method 100. The compound comprising a material for non-linear optics includes $Y_{(1-x)}M_xAl_3B_4O_{12}$. x is larger than or equal to zero and smaller than or equal to 0.1, and M is selected from a group consisting of Sc, La, Yb, and Lu. The compound is free from a molybdenum bearing impurity of at least 1000 parts per million.

According to yet another embodiment of the present invention, a compound for non-linear optics for use at 350 nm and below is made by the method 100. The compound comprising a material for non-linear optics includes $Yb_{(1-x)}M_xAl_3B_4O_{12}$. x is larger than or equal to zero and smaller than or equal to 0.1, and M is selected from a group consisting of Sc, Y, La, and Lu. The compound is free from a molybdenum bearing impurity of at least 1000 parts per million. According to yet another embodiment of the present invention, a compound for non-linear optics for use at 350 nm and below is made by the method 100. The compound comprising a material for non-linear optics includes $Lu_{(1-x)}M_xAl_3B_4O_{12}$. x is larger than or equal to zero and smaller than or equal to 0.1, and M is selected from a group consisting of Sc, Y, Yb, and La. The compound is free from a molybdenum bearing impurity of at least 1000 parts per million. According to yet another embodiment of the present invention, a compound for non-linear optics for use at 350 nm and below comprising a material for non-linear optics includes $Sc_{(1-x)}M_xAl_3B_4O_{12}$. x is larger than or equal to zero and smaller than or equal to 0.1, and M is selected from a group consisting of Y, La, Yb, and Lu. The compound is free from a molybdenum bearing impurity of at least 1000 parts per million.

According to yet another embodiment of the present invention, a compound for non-linear optics for use at 350 nm and below is made by the method 100. The compound comprising a material for non-linear optics includes $A_xM_{(1-x)}Al_3B_4O_{12}$. x is larger than or equal to zero and smaller than or equal to 0.1, A is selected from a group consisting of Sc, Y, La, Yb, and Lu, and M is selected from a group consisting of Sc, Y, La, Yb, and Lu. The compound is free from a molybdenum bearing impurity of at least 1000 parts per million. In one embodiment, M includes at least one selected from a group consisting of La, Lu, Sc, Y, and Yb. In another embodiment, A includes at least one selected from a group consisting of Sc, Y, La, Yb, and Lu.

As discussed above, according to certain embodiments, each of various types of optical compounds made by the method 100 is free from a molybdenum bearing impurity of at least 1000 parts per million. For example, the compound is free from a molybdenum bearing impurity of at least 500 parts per million. In another example, the compound is free from a molybdenum bearing impurity of at least 100 parts per million. In yet another example, the compound is free from a molybdenum bearing impurity of at least 10 parts per million. In yet another example, the compound is free from a molybdenum bearing impurity of at least 1 part per million. In yet another example, the compound is substantially free from a molybdenum bearing impurity. According to some embodiments of the present invention, each of various types of optical compounds made by the method 100 each is free from any impurity of at least 1000 parts per million that can prevent the compound from being used for non-linear optics at 350 nm and below. For example, the compound is free from any such impurity of at least 500 parts per million. In another example, the compound is free from any such impurity of at least 100 parts per million. In yet another example, the compound is free from any such impurity of at least 10 parts per million. In yet another example, the compound is free from any such impurity of at least 1 part per million. In yet another example, the compound is substantially free from any such impurity.

As discussed above, according to certain embodiments, each of various types of optical compounds made by the method 100 has a volume greater than about 0.001 $mm^3$. For example, the compound has a volume greater than about 0.01 $mm^3$. In another example, the compound has a volume greater than about 0.1 $mm^3$. In yet another example, the compound has a volume greater than about 1 $mm^3$.

According to some embodiments, various types of optical compounds made by the method 100 can be used for non-linear optics at 350 nm and below. For example, the use is associated with a wavelength ranging from about 350 nanometers to 160 nm. In another example, the use is associated with a wavelength ranging from about 350 nm to 170 nm. In yet another example, the use is associated with a device that generates optical radiation below 350 nm. In yet another example, the device comprises an NLO system, the compound associated with a laser system, and/or the compound associated with a light source.

According to certain embodiments, the method 100 can be used to make a compound for non-linear optics for use at 350 nm and below. For example, the compound is associated with the trigonal crystal class for use below 350 nm, and/or the space group R32 for use below 350 nm. In another example, the compound also includes dopant including at least one selected from a group consisting of Ce, Nd, and Yb. In one embodiment, the nonlinear optical material includes NYAB. In another embodiment, the nonlinear optical material includes Yb:YAB. In yet another embodiment, the nonlinear optical material includes Ce:YAB.

According to yet another embodiment of the present invention, a method for making a compound for non-linear optics for use at 350 nm and below includes providing a plurality of materials. The plurality of materials includes a lanthanum bearing compound, and the lanthanum bearing compound is capable of being decomposed into at least lanthanum oxide upon heating. Additionally, the method includes mixing the plurality of materials to form a mixture based on at least information associated with a predetermined proportion, starting a crystallization process in the mixture to form a crystal, and removing the crystal from the mixture, the crystal including lanthanum. For example, the plurality of materials comprises lanthanum oxide. In another example, the plurality of material further comprises boron oxide. In yet another example, the method further includes placing the mixture into a furnace. In yet another example, the method further includes heating the mixture to a first predetermined temperature, and cooling the mixture to a second predetermined temperature. In yet another example, the starting a crystallization process comprises inserting a crystalline seed to a melt surface. In yet another example, the crystal includes $A_xM_{(1-x)}Al_3B_4O_{12}$. x is larger than or equal to zero and smaller than or equal to 0.1, A is selected from a group consisting of Sc, Y, La, Yb, and Lu, and M is selected from a group consisting of Sc, Y, La, Yb, and Lu. In yet another example, the method is implemented according to the method 100.

According to yet another embodiment of the present invention, a method for making a compound for non-linear optics for use at 350 nm and below includes providing a plurality of materials. The plurality of materials includes an yttrium bearing compound, and the yttrium bearing compound is capable of being decomposed into at least yttrium oxide upon heating. Additionally, the method includes mixing the plurality of materials to form a mixture based on at least information associated with a predetermined proportion, starting a crystallization process in the mixture to form a crystal, and removing the crystal from the mixture, the crystal including yttrium. For example, the plurality of materials includes yttrium oxide. In another example, the plurality of material further includes boron oxide. In yet another example, the method further includes placing the mixture into a furnace. In yet another example, the method further includes heating the mixture to a first predetermined temperature, and cooling the mixture to a second predetermined temperature. In yet another example, the starting a crystallization process comprises inserting a crystalline seed to a melt surface. In yet another example, the crystal includes $A_xM_{(1-x)}Al_3B_4O_{12}$. x is larger than or equal to zero and smaller than or equal to 0.1, A is selected from a group consisting of Sc, Y, La, Yb, and Lu, and M is selected from a group consisting of Sc, Y, La, Yb, and Lu. In yet another example, the method is implemented according to the method 100.

It is understood the examples and embodiments described herein are for illustrative purposes only and that various modifications or changes in light thereof will be suggested to persons skilled in the art and are to be included within the spirit and purview of this application and scope of the appended claims.

What is claimed is:

1. A non-linear optical material comprising a $YAl_3B_4O_{12}$ crystal; wherein the material contains less than 1000 parts per million of a molybdenum bearing impurity and is capable of generating ultraviolet light at 266 nm.

2. The material of claim 1 wherein the material contains less than 500 parts per million of a molybdenum bearing impurity.

3. The material of claim 2 wherein the material contains less than 100 parts per million of a molybdenum bearing impurity.

4. The material of claim 3 wherein the material contains less than 10 parts per million of a molybdenum bearing impurity.

5. The material of claim 4 wherein the material contains less than 1 part per million of a molybdenum bearing impurity.

6. The material of claim 5 wherein the material is substantially free from a molybdenum bearing impurity.

7. The material of claim 1 wherein the ultraviolet light comprises laser light.

8. The material of claim 1 wherein the material is associated with the trigonal crystal class for use below 350 nm.

9. The material of claim 1 wherein the material is associated with the space group R32 for use below 350 nm.

10. The material of claim 1, and further comprising a dopant including at least one selected from a group consisting of Ce, Nd, and Yb.

11. The material of claim 10 wherein the material comprises NdYAB.

12. The material of claim 10 wherein the material comprises Yb:YAB.

13. The material of claim 10 wherein the material comprises Ce:YAB.

14. The material of claim 1 wherein the material contains less than 1000 parts per million of a lead bearing impurity.

15. The material of claim 14 wherein the material contains less than 500 parts per million of a molybdenum bearing impurity.

16. The material of claim 15 wherein the material contains less than 100 parts per million of a molybdenum bearing impurity.

17. The material of claim 16 wherein the material contains less than 10 parts per million of a molybdenum bearing impurity.

18. The material of claim 17 wherein the material contains less than 1 part per million of a molybdenum bearing impurity.

19. The material of claim 18 wherein the material is substantially free from a molybdenum bearing impurity.

* * * * *